(12) United States Patent  
Visconti

(10) Patent No.: US 7,110,300 B2
(45) Date of Patent: Sep. 19, 2006

(54) METHOD OF PROGRAMMING A MULTI-LEVEL, ELECTRICALLY PROGRAMMABLE NON-VOLATILE SEMICONDUCTOR MEMORY

(75) Inventor: Angelo Visconti, Appiano Gentile (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 203 days.

(21) Appl. No.: 10/782,725

(22) Filed: Feb. 19, 2004

(65) Prior Publication Data

US 2004/0240270 A1   Dec. 2, 2004

(30) Foreign Application Priority Data

Feb. 20, 2003   (EP)  .................................. 03425096

(51) Int. Cl.
G11C 11/34   (2006.01)
G11C 16/06   (2006.01)

(52) U.S. Cl. .......................... 365/185.22; 365/185.03; 365/185.19

(58) Field of Classification Search ........... 365/185.22, 365/185.03, 185.11, 185.14, 185.19
See application file for complete search history.

(56) References Cited

U.S. PATENT DOCUMENTS

| 5,926,409 | A | 7/1999 | Engh et al. | |
|---|---|---|---|---|
| 6,414,893 | B1 * | 7/2002 | Miyamoto | 365/219 |
| 6,646,913 | B1 * | 11/2003 | Micheloni et al. | 365/185.03 |
| 6,788,579 | B1 * | 9/2004 | Gregori et al. | 365/185.19 |
| 6,967,872 | B1 * | 11/2005 | Quader et al. | 365/185.22 |

FOREIGN PATENT DOCUMENTS

| EP | 0 763 828 | 3/1997 |
|---|---|---|
| EP | 0 908 895 | 4/1999 |
| WO | WO 01/63613 | 8/2001 |

OTHER PUBLICATIONS

Roberto Versari et al., "Optimized Programming of Multilevel Flash Eeproms", ICECS 2001: 8th IEEE International Conference on Electronics, Circuits and Systems, vol. 2, Sep. 2, 2001, pp. 945-948, XP010563149.

David Esseni et al., Trading-Off Programming Speed and Current Absorption in Flash Memories with the Ramped-Gate Programming Technique, IEEE Transactions on Electron Devices, vol. 47, No. 4, Apr. 2000, pp. 828-834, XP001131051.

European Search Report dated Jul. 25, 2003 for European Application No. 03425096.9.

* cited by examiner

Primary Examiner—Son T. Dinh
Assistant Examiner—Toan Le
(74) Attorney, Agent, or Firm—Lisa K. Jorgenson; Jose Gutman; Fleit, Kain, Gibbons, Gutman, Bongini & Bianco P.L.

(57) ABSTRACT

A method of programming a multi-level, electrically-programmable memory with memory cells electrically programmable into at least two distinct programmed states, includes: defining at least two programming sequences, each one being designed for bringing memory cells into at least one respective programmed state; receiving a pattern of data to be written into a selected group of memory cells of the memory; analyzing the pattern for determining sub-groups of memory cells, each sub-group of memory cells including the memory cells in the selected group that are to be brought into at least a respective one of the at least two programmed states; and submitting the memory cells in each sub-group to the respective programming sequence. A memory circuit and a computing system are also provided.

21 Claims, 5 Drawing Sheets

METHOD OF PROGRAMMING A MULTI-LEVEL, ELECTRICALLY PROGRAMMABLE NON-VOLATILE SEMICONDUCTOR MEMORY

CROSS-REFERENCE TO RELATED APPLICATION

This application is based upon and claims priority from prior European Patent Application No. 03425096.9, filed on Feb. 20, 2003, the entire disclosure of which is herein incorporated by reference.

BACKGROUND OF THE INVENTION

1. Field of the Invention

The present invention generally relates to the field of semiconductor memories, particularly to electrically programmable memories and, even more particularly, to non-volatile memories such as, for example, EPROMs, EEPROMs and Flash memories. Specifically, the invention concerns a method of programming a multi-level, electrically programmable non-volatile memory.

2. Description of the Related Art

Electrically programmable, non-volatile semiconductor memories have memory cells formed by MOS transistors, whose threshold voltage can be varied electrically in order to store the desired information.

The number of different values that the threshold voltage of a memory cell may take depends on the number of bits that the memory cell is intended to store. For example, in two-levels memories having memory cells intended to store only one bit each, the threshold voltage of each memory cell can take one of two different values, which are associated with the two opposite binary logic states ("1" and "0"). In multi-level memories, whose memory cells are intended to store more than one bit, the number of different threshold voltage values is equal to $2^n$, where n identifies the number of bits stored in each memory cell. Multi-level memories are also known in which n bits are stored in k memory cells, with k<n and n/k is not necessarily an integer number; in this case, the number of different values that the memory cell threshold voltage may take is higher than two, but not necessarily equal to a power of two.

Programming a memory cell means bringing the memory cell threshold voltage to the desired value, starting from a memory cell erased condition in which the threshold voltage value is equal to or lower than the lowest of the prescribed values. Typically, in order to increase the memory cell threshold voltage, electrons are injected into a memory cell conductive floating gate of, e.g., polysilicon, or into a memory cell charge-trapping element (typically, a layer of silicon nitride); the charge present in the floating gate or trapped in the charge-trapping element affects the formation of a conductive channel when a gate voltage is applied to a memory cell control gate.

Electrons are for example injected into the floating gate or charge-trapping element by means of the channel hot-electron injection mechanism, which is triggered by applying suitable programming voltages to the memory cell terminals; this mechanism is typically exploited in EPROMs and Flash memories having the so-called NOR architecture. Another mechanism of injecting electrons into the floating gate or charge-trapping element is electron tunnelling; this mechanism is for example exploited in EEPROMs and in EPROMs and Flash memories with the so-called NAND architecture.

The data stored in the memory cell are retrieved by accessing the memory cell in read conditions. Prescribed read voltages are applied to the memory cell terminals, and, e.g., the current sunk by the memory cell is sensed. The higher the memory cell threshold voltage, the lower the current sunk by the memory cell.

The data stored in the memory cell are thus determined by comparing the sensed current to a prescribed reference current or, in the case of a multi-level memory, to a plurality of reference currents.

Multi-level memories, especially of the Flash type, are experiencing an increasing market demand. Features such as high storage density, compactness, ruggedness, low cost, low power consumption make multi-level memories particularly adapted to applications such as silicon storage disks, palmtops, digital still cameras and memory cards. The reason of the success of multi-level memories is that they offer storage densities achievable only by means of two-levels memories of more advanced technological generations, allowing in this way to take full advantage of an already mature technology.

Conventional programming methods of multi-level memories call for programming in parallel a relatively high number of memory cells, so as to increase the programming speed; for example, in four-levels memories, sixty-four memory cells (i.e., 128 data bits) are programmed in parallel, irrespective of the different programmed states that the different memory cells are intended to reach. A sequence of programming pulses is applied to the group of memory cells to be programmed. Each programming pulse provides for applying to the memory cell terminals the proper programming voltages for a prescribed, relatively short time; in particular, the voltage applied to the memory cell control gate is progressively increased at each programming pulse: it has in fact been observed that if the voltage applied to the memory cell control gate is progressively increased at each programming pulse, the memory cell threshold voltage progressively increases following the increase in the control gate voltage.

The lower the control gate voltage increase at each programming pulse, the finer the positioning of the threshold voltage; typically, the control gate voltage undergoes a swing of about 7 V, with an increase of approximately 0.3 V at each programming pulse.

Each programming pulse determines a slight increase in the memory cell threshold voltage. After each programming pulse, a program verify is performed: the memory cells under programming are read to assess whether they have reached the intended programmed state. No more programming pulses are applied to the memory cells that are assessed to have reached the desired programmed state.

The programming operation ends when all the memory cells to be programmed are assessed to have reached the desired programmed state. In the conventional programming method, both the programming current and the programming speed are proportional to the number of memory cells programmed in parallel to each other; in other words, the speed/power ratio is constant.

The Applicant has observed that due to the relatively high degree of parallelism of the program operation, there is a relatively high statistical probability that at least one of the memory cells has to be brought to the programmed state more distant from the erased state, i.e. the programmed state corresponding to the highest threshold voltage level (in a four-levels memory cell, this state is conventionally referred to as the "00" state). This means that, given the small increase of the control gate voltage at each programming pulse, a relatively high number of programming pulses have to be applied for programming these memory cells; by way of example, twenty to twenty-five programming pulses may have to be applied (each one followed by the respective program verify phase). The programming time is typically relatively long and substantially independent from the pattern of data to be programmed.

Accordingly, there exists a need for overcoming the disadvantages of the prior art as discussed above.

SUMMARY OF THE INVENTION

In view of the state of the art outlined above, it has been an object of the present invention to provide a new programming method capable of reducing the programming time.

According to the present invention, this and other objects are achieved by means of a programming method as set forth in the appended claim 1.

In summary, different programming sequences are first of all defined for bringing memory cells into different programmed state.

For the purposes of the present invention, by programming sequence there is intended a particular evolution in time of the biasing conditions of the memory cells, directed to causing the memory cell to be brought into a desired programmed state. For example, a programming sequence can be a particular sequence of programming pulses applied to the memory cells, that includes applying a voltage ramp of prescribed slope to a control gate electrode of the memory cells while keeping constant the voltages of the other memory cell terminals.

A pattern of data to be written into a selected group of memory cells of the memory is then received; the pattern is then analysed for determining sub-groups of memory cells, each sub-group of memory cells including the memory cells in the selected group that are to be brought into a respective one of the distinct programmed states. The memory cells in each sub-group are then submitted to the respective programming sequence.

In other words, instead of having a standard programming sequence that is applied to the memory cells to be programmed irrespective of the target programmed state, different programming sequences are provided for different target programmed states, each programming sequence being optimised for the respective different programmed state or states.

BRIEF DESCRIPTION OF THE DRAWING

The features and advantages of the present invention will be made apparent by the following detailed description of an embodiment thereof, provided merely by way of non-limitative example, which will be made in connection with the attached drawing sheets, wherein.

DESCRIPTION OF THE PREFERRED EMBODIMENTS

Figure 1:
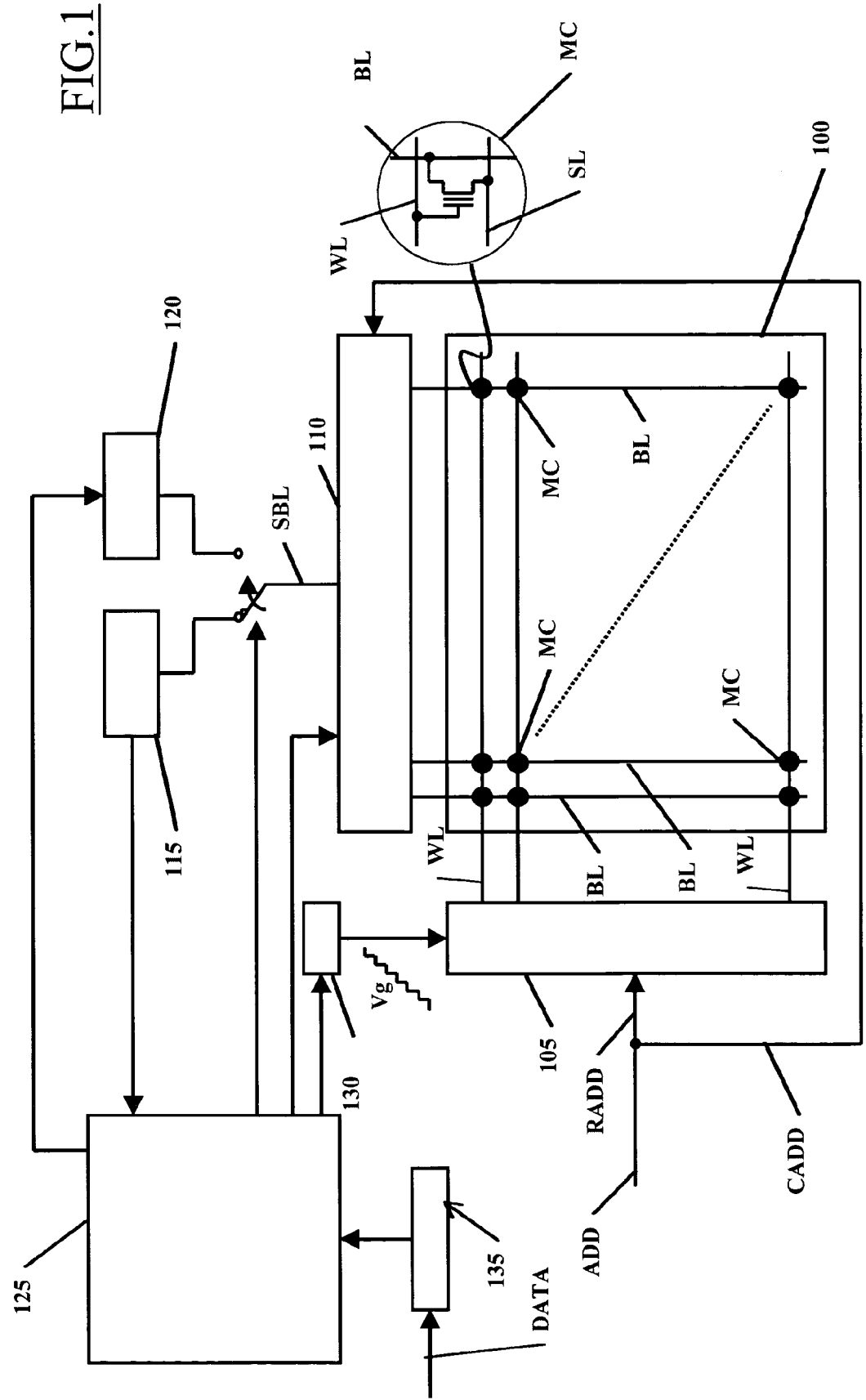
FIG. 1 shows, quite schematically, a multi-level, electrically programmable non-volatile memory in which a programming method according to an embodiment of the present invention is implemented.

With reference to the drawings, FIG. 1 shows schematically the main functional blocks of a multi-level electrically-programmable memory. The memory has a storage area comprising a two-dimensional arrangement or matrix 100 of memory cells MC. The memory cells MC are electrically programmable in any one of a plurality of different states or levels, e.g. four levels. In particular, the memory cells MC are MOS type transistors, and each programming level corresponds to a respective value of the MOS transistor threshold voltage. For example, the memory cells MC are floating-gate MOS transistors, or MOS transistors having a charge-trapping element, and the threshold voltage can be varied by injecting electrons into the floating-gate or the charge-trapping element.

The memory cells MC are conventionally arranged by rows or word lines WL and columns or bit lines BL; in particular, each memory cell MC has a control gate electrode connected to a respective word line WL and a drain electrode connected to a respective bit line BL; a source electrode of each memory cell is connected to a source line SL. In the exemplary case of a Flash memory, the source line SL can be switched between a read voltage, typically 0 V, used for reading the memory cells, and an erase voltage, typically 5 or 6 V, for erasing the memory cells.

It is pointed out that in the case of a Flash memory the storage area may include two or more individually-erasable memory sectors.

A conventional row address decoder and word line selection circuitry 105 receives a row address digital code RADD, decodes it and selects one among the plurality of word lines WL. Similarly, a conventional column address decoder and bit line selection circuitry 110 receives a column address digital code CADD, decodes it and selects a corresponding packet of bit lines among the plurality of bit lines BL. The row address RADD and the column address CADD form, altogether, an address digital code ADD fed to the memory for accessing it either in reading or programming.

The selected bit lines SBL are coupled to a memory cell sensing circuitry 115 or a memory cell programming circuitry 120, depending on the type of operation to be performed. In particular, the selected bit lines are coupled to the programming circuitry 120 when programming pulses are to be applied to the memory cells of the selected bit lines and word line; the selected bit lines are instead coupled to the sensing circuitry 115 when the programming level of the memory cells is to be assessed, either for retrieving the data stored therein (standard read operation) or for verifying whether or not the memory cells have been programmed after a programming pulse (program verify read operation).

The operation of the memory is governed by a control circuit 125. In particular, on the basis of the operation to be carried out, the control circuit 125 causes the selected bit lines SBL to be coupled to the sensing circuitry 115 or to the programming circuitry 120; the control circuit 125 causes the programming circuitry 120 to bias the selected bit lines SBL to the correct potentials, depending on the data to be written into the respective memory cells; the control circuit 125 also controls a word line voltage generator 130, generating voltages to be applied to the word line selected by the row selection circuitry 105, and thus to the control gates of the memory cells MC belonging to such word line. In particular, during a programming operation, the control circuit 125 causes the word line voltage generator 130 to generate voltage ramps of prescribed slopes, as will be described in greater detail later on.

The control circuit 125 may include a programmable logic, for example a microcontroller, with respective RAM and ROM resources, capable of executing a microprogram stored in the respective ROM. It is pointed out that, in principle, nothing prevents from implementing the control circuit 125 by means of logic gates.

A write buffer 135 is provided for acting as a buffer in which data to be written into selected memory cells, received by the memory through input/output data lines DATA, are temporarily stored, until such memory cells are programmed.

A programming method according to an embodiment of the present invention will be described hereinbelow. For the sake of simplicity, in the following description it will be assumed that the memory cells MC are capable of storing two bits each, i.e., the threshold voltage of the memory cells MC can take any one of four different values. The four different threshold voltage values correspond to four different memory cell states, conventionally referred to as "11", "10", "01" and "00"; the four memory cell states include one non-programmed state, and three programmed states. A non-programmed memory cell has the lowest threshold voltage value, conventionally corresponding to the state "11"; the two next threshold voltage values conventionally correspond to the states "10" and "01", respectively; the highest threshold voltage value conventionally corresponds to the state "00". Considering for example a current-based sensing technique of the memory cells, the four different threshold voltage values becomes four different values of memory cell current when the latter is biased in prescribed conditions.

Figure 2:
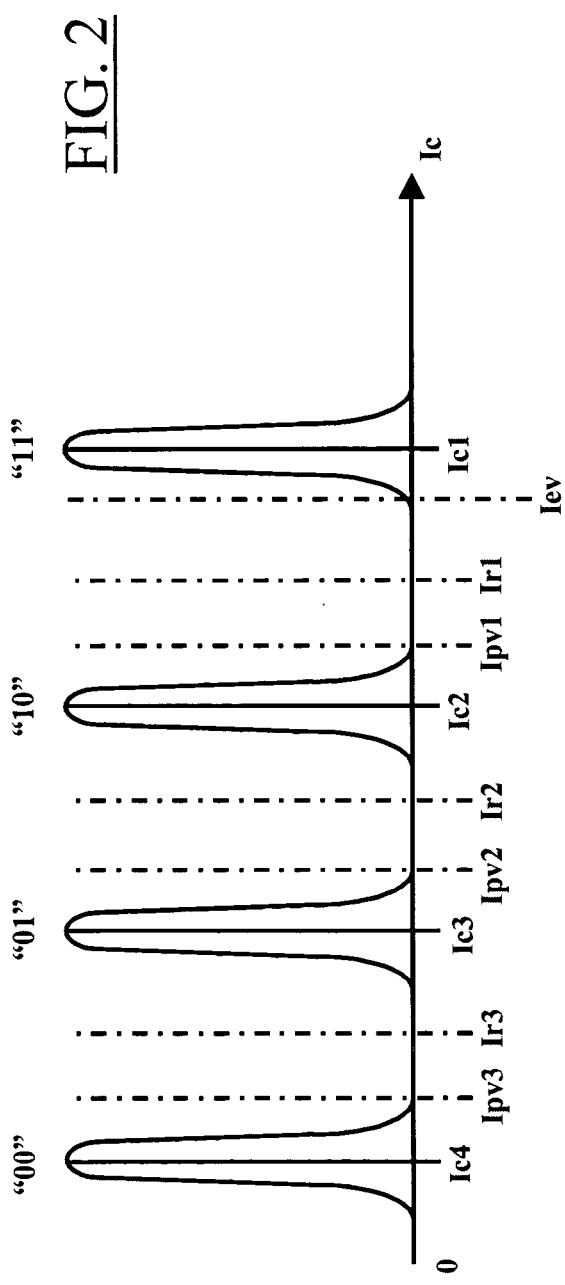
FIG. 2 is a diagram showing the relation between memory cell currents, standard read reference currents and program verify read reference currents, in the exemplary case of a four-levels memory.

FIG. 2 shows schematically the distribution of the four different programming levels, in terms of memory cell currents, and current references adopted in the sensing circuitry 115 for reading the memory cells in standard read and program verify read conditions. In particular, a horizontal axis Ic represents memory cell current values. Ir1, Ir2 and Ir3 and Ipv1, Ipv2 and Ipv3 represent reference current values used for discriminating the four possible states of memory cells in standard read conditions and in program verify read conditions, respectively; it can be appreciated that the program verify read conditions are deliberately made more critical compared to the standard read conditions, so as to guarantee a sufficient programming margin. Iev represent a reference current value used in erase verify read conditions for ensuring that the memory cells are erased (i.e., the memory cells are in the non-programmed stated). Ic1, Ic2, Ic3 and Ic4 represent possible values of current sunk by memory cells in each one of the four possible states; in particular, Ic1, Ic2, Ic3 and Ic4 are assumed to be the average values of statistical distributions of currents for memory cells in the different states ("11", "10", "01" and "00"). It is pointed out that FIG. 2 refers to a current-mode sensing technique, which is not to be intended as a limitation to the present invention; voltage-mode sensing techniques can as well be adopted.

It is also assumed that the write buffer 135 has a dimension of 256 bits, the sensing circuitry 115 is capable of sensing sixty-four memory cells in parallel, and that the programming circuitry 120 is designed so as to be capable of sustaining the programming of up to sixty-four memory cells in parallel (equal to 128 bits), following the conventional programming method, which calls for performing two programming cycles in sequence, with identical evolution of the control gate voltage in each cycle. In each programming cycle of the conventional programming method, sixty-four memory cells are programmed, irrespective of the programmed state the memory cells are intended to reach.

Figure 3:
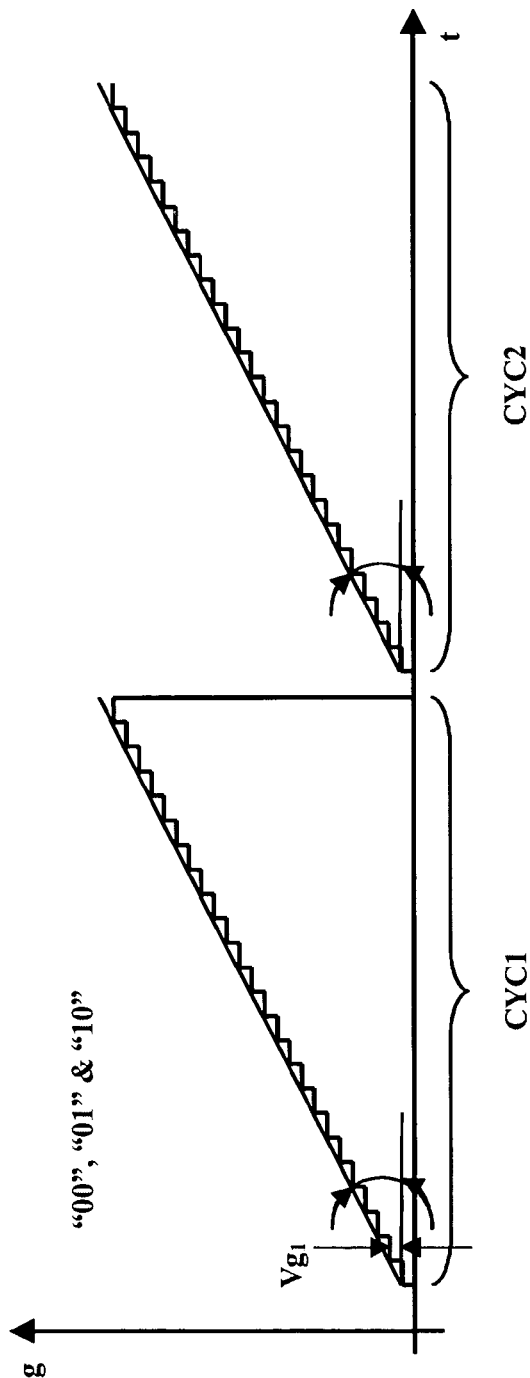
FIG. 3 shows a sequence of programming pulses according to a conventional programming method.

FIG. 3 is a time diagram schematically showing the evolution of the control gate voltage of the memory cells to be programmed, in the conventional programming method. Two programming cycles CYC1 and CYC2 are performed in succession. In each one of the two programming cycles CYC1 and CYC2, sixty-four memory cells are programmed in parallel; in each cycle, a sequence of programming pulses is applied to the sixty-four memory cells, with a control gate voltage ramp having a prescribed slope α (e.g., the increment $\Delta Vg_1$ in the control gate voltage is equal to 0.3 V). Substantially after each programming pulse, the sixty-four memory cells are accessed in program verify read conditions and, as soon as any given memory cell is detected to have reached the desired programmed state, it is applied no more programming pulses. The slope α of the control gate voltage ramp, i.e. the increment $\Delta Vg_1$ in the control gate voltage, is chosen to be relatively small, so as to enable the correct positioning of the memory cells intended to store a "01" and, especially, a "10"; with a too high slope α there would be the risk of overprogramming the memory cells intended to store the "10" and a "01"; due to the small value of the slope α, programming a memory cell intended to store a "00" requires the application of a relatively high number of programming pulses, normally between twenty and twenty-five. Statistically, within the sixty-four memory cells there is a high probability that a memory cell intended to store a "00" exist. This means that each of the two programming cycles CYC1 and CYC2 requires the application of twenty to twenty-five programming pulses, for a total of forty to fifty programming pulses. In other words, in the conventional programming method the slope of the control gate voltage ramp is calibrated for the fine tuning of the "10" and "01" programmed states, so that programming memory cells intended to store "01" and "00" states requires several programming pulses, and the programming time is long.

Figure 4:
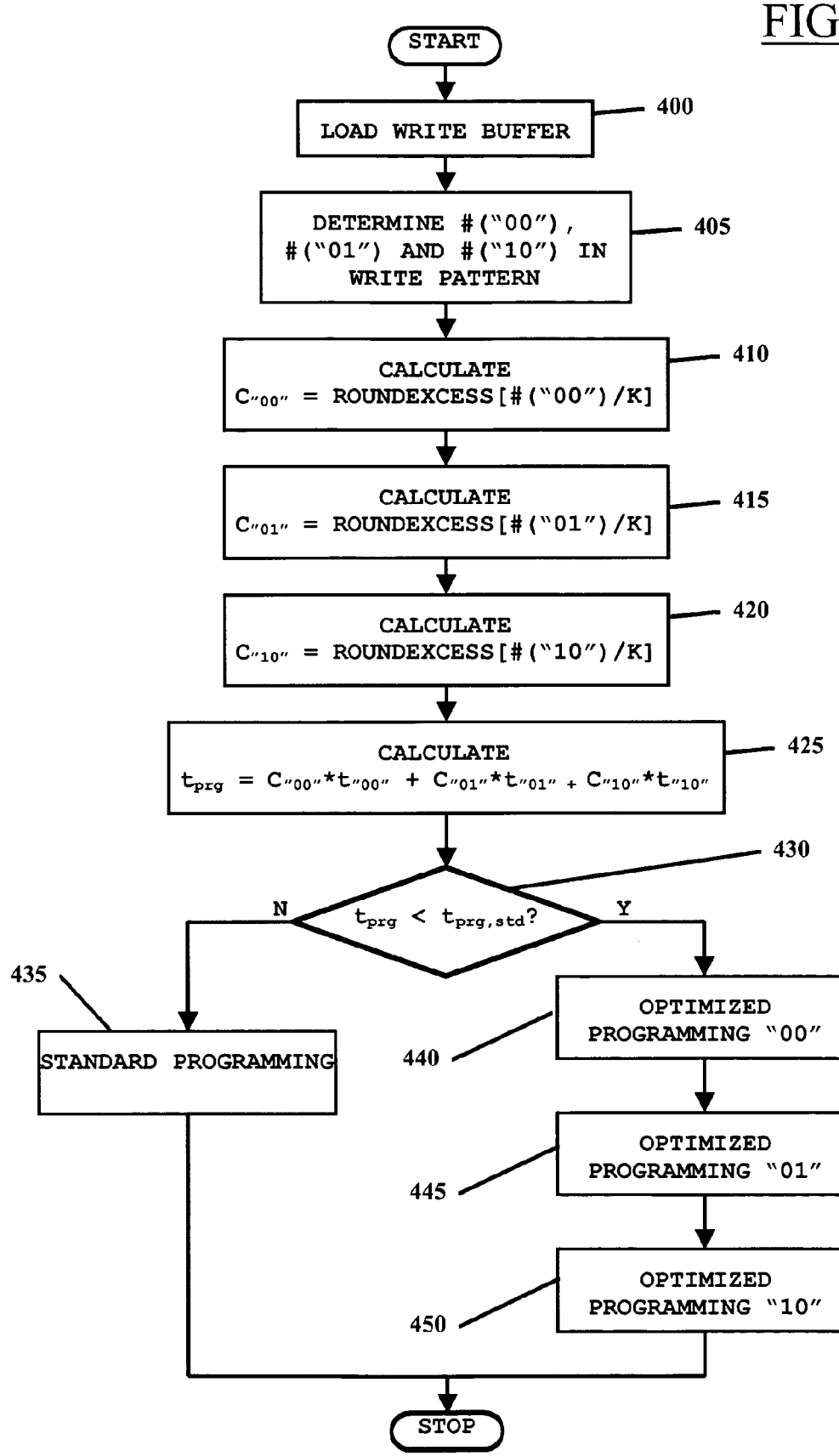
FIG. 4 is a flowchart illustrating the main steps of a programming method according to an embodiment of the present invention.

FIG. 4 is a flowchart of a programming method according to an embodiment of the present invention.

First of all, the write buffer 135 is loaded (block 400) with the data to be written into the memory. The data are fed to the memory through the input/output data lines DATA. In the example described herein, two words of 128 bits are loaded into the write buffer 135. The data loaded into the write buffer 135 form the write pattern. The memory cells into which the data loaded into the write buffer 135 are to be written are selected by means of an address ADD supplied to the memory.

Figure 6:
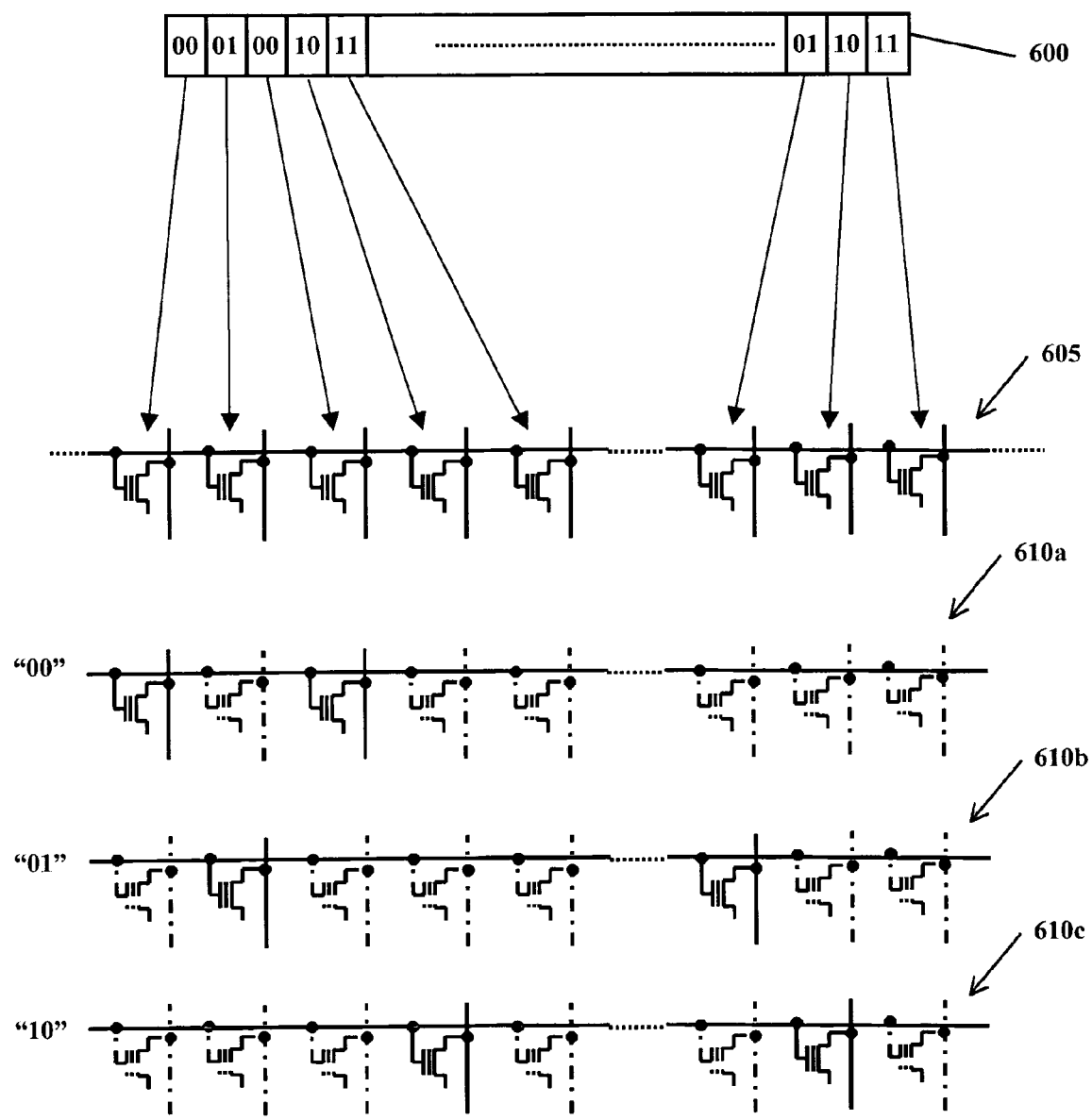
FIG. 6 schematically shows a group of memory cells selected for programming, and memory cells sub-groups each including memory cells intended to be brought to an identical programmed state.

Referring jointly to FIGS. 4 and 6, the control circuit 125 reads the write pattern from the write buffer 135, and analyses the write pattern 600 so as to determine, within the group 605 of memory cells MC selected for being programmed, sub-groups 610a, 610b and 610c of memory cells that are to be brought to the same programmed state "00", "01" and "10", respectively (in the drawing, the memory cells not included in a sub-group are depicted in phantom).

In particular, the control circuit 125 determines the number #("00") of memory cells intended to store a "00", the number #("01") of memory cells intended to store a "01", and the number #("10") of memory cells intended to store a "10" (block 405).

Since, as will be described hereinbelow, in some cases the programming method involves control gate voltage ramps steeper than that of the conventional programming method, in the memory design phase a parameter K is defined; the parameter K is a number equal to or lower than the degree of potential parallelism of the programming circuitry 120, corresponding to a reduced degree of programming parallelism chosen to avoid excessive increase in the programming current that the programming circuitry shall supply. For example, the parameter K is equal to one-fourth or, preferably, one-third of the length of the write buffer in terms of number of memory cells.

The control circuit 125 then compares each of the numbers #("00"), #("01"), #("10") to the parameter K. More specifically, and in an embodiment of the present invention, the control circuit 125 calculates the ratio of each of the numbers #("00"), #("01"), #("10") to the parameter K, and then rounds each of such calculated ratios to the next higher integer (blocks 410, 415 and 420). The numbers $C_{"00"}$, $C_{"01"}$, $C_{"10"}$ thus calculated allows the control circuit 125 determining whether, given the reduced degree of parallelism K of the programming circuitry, the memory cells intended to store a "00", or a "01", or a "10" can be programmed in parallel in a single programming cycle, or more than one programming cycle is required; in particular, the numbers $C_{"00"}$, $C_{"01"}$, $C_{"10"}$ indicate the number of programming cycles necessary to program the memory cells intended to store a "00", or a "01", or a "10". For example, if the number of "00"s in the write pattern is higher than K, it will not be possible to program in parallel and in a single programming cycle all the memory cells intended to store "00", and more than one programming cycle will be necessary for programming these memory cells.

Based on the numbers $C_{"00"}$, $C_{"01"}$, $C_{"10"}$, the control circuit 125 estimates a total programming time $t_{prg}$ (block 425). The estimated total programming time $t_{prg}$ is calculated as:

$$t_{prg} = C_{"00"} * t_{"00"} + C_{"01"} * t_{"01"} + C_{"10"} * t_{"10"}$$

where $t_{"00"}$, $t_{"01"}$ and $t_{"10"}$ are the typical times required for programming a memory cell intended to store a "00", a "01" and "10", respectively, by means of three different predefined programming sequences, each of which is optimised for the respective programmed state to be achieved.

The control circuit 125 then compares (decision block 430) the estimated total programming time $t_{prg}$ thus calculated to the standard average programming time $t_{prg,std}$, equal to the average time necessary to write the data in the write buffer 135 into the selected memory cells following the standard programming method (the two cycles CYC1 and CYC2 of FIG. 3 in succession). If the estimated total programming time $t_{prg}$ is not lower than the standard average programming time $t_{prg,std}$ (decision block 430, exit branch N), the standard programming method (FIG. 3) is followed for writing the write pattern into the selected memory cells (block 435); on the contrary, if the estimated total programming time $t_{prg}$ is lower than the standard programming time $t_{prg,std}$ (decision block 430, exit branch Y), the memory cells intended to store a "00", a "01" and a "10" are programmed separately, following three distinct predefined programming sequences. Preferably, the memory cells intended to store a "00" are programmed first (block 440), followed by the memory cells intended to store a "01" (block 445) and, finally, by the memory cells intended to store a "10" (block 450). Clearly, the memory cells intended to store a "11" are not programmed.

Figure 5A:
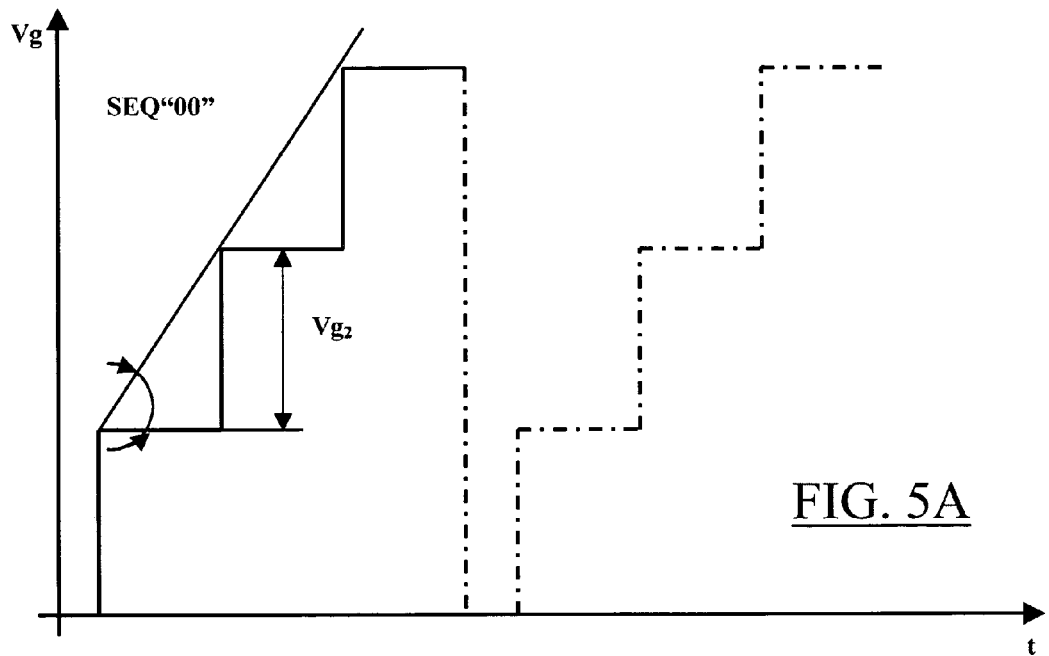
FIGS. 5A, 5B and 5C shows three sequences of programming pulses according to an embodiment of the present invention, each one designed for a respective programmed state of four-levels memory cells.
Figure 5B:
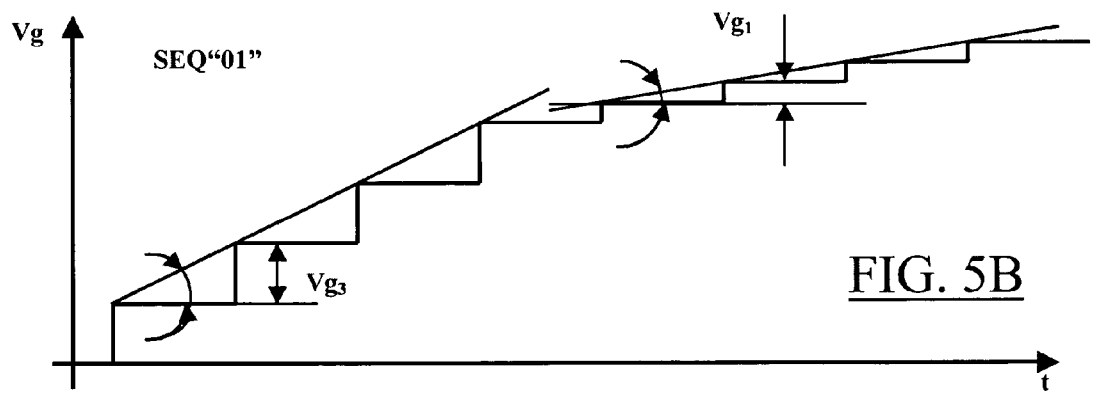
Figure 5C:
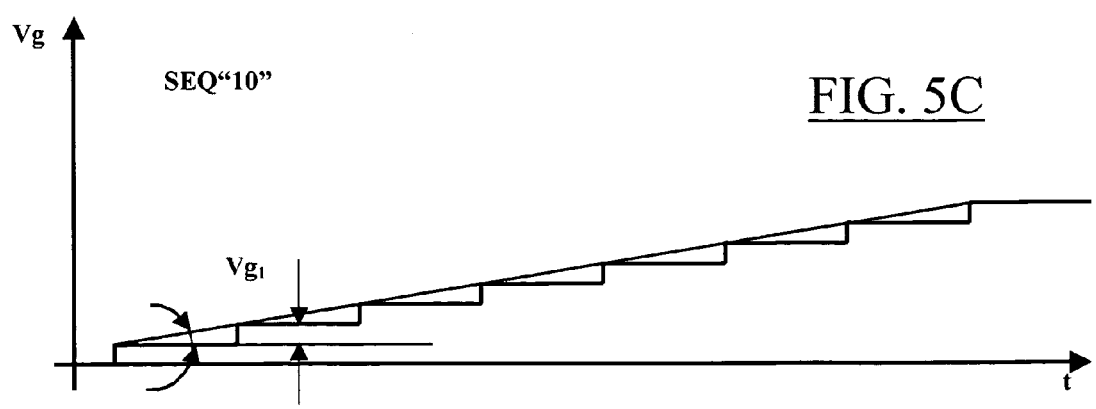

FIGS. 5A, 5B and 5C show three sequences of programming pulses according to an embodiment of the present invention, optimised for programming memory cells intended to store a "00", a "01" and a "10", respectively.

Let the programmed state "00" be first considered (FIG. 5A): this programmed state corresponds to the threshold voltage level more distant from the non-programmed or erased level of the memory cell. The memory cells to be brought to the state "00" are the less critical, because the threshold voltage thereof needs not be finely positioned: it is sufficient to guarantee that the threshold voltage is shifted so high that the current sunk by the memory cells in program verify read conditions is lower than the reference current Ipv3. The memory cells intended to store a "00" can thus be programmed as if they were two-levels memory cells, by applying a single programming pulse at the maximum possible control gate voltage; alternatively, few (e.g., three or four) programming pulses are applied to the memory cells, with a relatively high increment $\Delta V g_2$ in the control gate voltage at each pulse, so that the control gate voltage ramp is very steep, having for example a slope $\beta$ equal to or higher than four times the basic slope $\alpha$ of the standard programming method. A program verify read access to the memory cells after each programming pulse is optional.

Passing to the programmed state "01" (FIG. 5B), a first part of the programming cycle is carried out with a control gate voltage ramp steeper than that adopted in the standard programming method, although preferably not so steep as that used for programming the memory cells intended to store a "00" (to avoid any risk of overprogramming); for example, the increment $\Delta V g_3$ in the control gate voltage, and thus the slope $\gamma$ of the control gate voltage ramp, can be from two to four times the standard increase $\Delta V g_1$, i.e. two to four times the basic slope $\alpha$. After each programming pulse, a read access is performed; as soon as one of the memory cells intended to store a "01" is detected to sunk a current lower than Ir2, the slope of the control gate voltage ramp is reduced to, for example, the basic slope $\alpha$, and the programming cycle is completed by increasing of $\Delta V g_1$ the control gate voltage so as to finely position the memory cell threshold voltage. Programming the memory cells in this way may require from eight to ten programming pulses.

Finally, the memory cells intended to store a "10" are programmed by applying a control gate voltage ramp with the basic slope $\alpha$; a total of seven to nine programming pulses is sufficient for programming these memory cells.

If the number of memory cells intended to store a "00", a "01" or a "10" is not higher than the reduced degree of parallelism K of the programming circuitry 120, the three programming sequences shown in FIGS. 5A, 5B and 5C will be on average sufficient to program all the selected memory cells. The programming operation will thus last, on average, at most eighteen to twenty-three programming pulses, which means half the time required by the conventional programming method.

If the number of memory cells intended to store a "00", a "01" or a "10" is higher than the reduced degree of parallelism K of the programming circuitry 120, the respective programming sequence needs to be repeated for a number of times equal to the number $C_{"00"}$, $C_{"01"}$, $C_{"10"}$, (for example, if the number of memory cells intended to store a "00" is higher than K but not higher than 2K, the sequence is repeated twice, as shown in phantom in FIG. 5A). In this case, the time required by the programming operation increases. However, should the programming time exceed the time required by the conventional programming method, the latter is adopted (block 430). In this way, it is assured that the total programming time is at most equal to the programming time under the conventional programming method.

It is observed that in an alternative embodiment of the present invention, the actions schematised by the blocks 410 to 430 may be dispensed for, and the memory cells be programmed adopting the three different programming sequences (blocks 440, 445 and 450) irrespective of the fact that the programming time is higher or lower than the standard programming time; in this case, the operation flow jumps directly from the block 405 to the block 440.

The different groups of memory cells to be brought into different programmed states can be in principle programmed in any order. However, it is preferable to program the different groups of memory cells starting from the group of memory cells to be brought into the programmed state ("00") that corresponds to the threshold voltage level more distant from that corresponding to the non-programmed or erased state ("11"), and then down to the group of memory cells to be brought into the programmed state ("10") closest to the non-programmed state ("11").

There are in fact factors that cause the actual conditions in which a programmed memory cell is normally read to depart from the program verify conditions to such an extent that the programmed memory cell may be read as non-programmed even if it passed the program verify test during the programming phase.

These factors include for example parasitic resistances of the supply voltage lines and signal lines, such as the memory cell source resistance, i.e., the resistance unavoidably present in series to the memory cell source electrode. The source resistance introduces a voltage drop, that depends on the current flowing therethrough. When a memory cell that has been submitted to a programming pulse is accessed in program verify read conditions, a plurality of (e.g., sixty-four) memory cells are actually accessed simultaneously: the current flowing through the source line parasitic resistance depends not only on the programmed state of the memory cell being inspected, but also on the programmed state of the other memory cells accessed. If, as highly probable, one or more of the other memory cells accessed change their programmed state after the memory cell under consideration has been verified as programmed, for example because when the memory cell is verified the other memory cells are not yet programmed and need to be applied further programming pulses, the different (lower) voltage drop across the source line parasitic resistance, due to the different (lower) current flowing therethrough, changes (increases) the gate-to-source drive voltage experienced by the memory cell under consideration, which may thus be read as non-programmed.

Similar considerations apply for other parasitic resistances, such as for example those associated with the supply voltage lines for the sensing circuits.

By programming first the memory cells intended to be brought to programming levels more distant from that corresponding to the non-programmed condition, it is assured that the conditions under which the memory cells are verified as programmed closely resemble, not to say coincide, with the conditions under which the memory cells will be accessed in standard read.

More generally, the different groups of memory cells to be brought into different programmed states are programmed in a time sequence such that the conditions in which, in a program verify read access, a given memory cell is verified as programmed to the desired programmed state substantially coincide or at least most closely resemble the conditions in which that memory cell will be read in a standard read access.

The programming method according to the present invention allows increasing the speed/power ratio of the programming operation with respect to the conventional programming method.

In particular, for a same average programming speed as the conventional programming method, the programming method according to the present invention requires a significantly lower peak programming current, and thus a lower maximum power; this means that a smaller semiconductor area needs to be reserved for the programming circuitry. The Applicant has in fact observed that the current sunk by a memory cell under programming is not proportional to the slope of the control gate voltage ramp, being instead substantially proportional to the square root of the slope. Thus, the current necessary for programming in parallel a given number of cells with a control gate voltage ramp having a given slope is higher than the current required for programming separately half the number of cells with a control gate voltage ramp of twice the slope, although the programming speed is the same in the cases (the programming speed is proportional to the number of memory cells programmed in parallel by the slope of the control gate voltage ramp).

Conversely, for a same peak programming current (i.e., for a same maximum power and thus for a same semiconductor area to be reserved to the programming circuitry) as the conventional programming method, a higher number of memory cells can be programmed in the unit time, and thus a higher programming speed is achieved.

The memory designer can trade off the programming speed and the maximum power by changing the degree of parallelism of the programming circuitry.

For example, if the target parameter is the programming speed, statistical considerations suggest that, on average, the number of memory cells intended to store any one of the four different programmed states will be one eighth of dimension in bits of the write buffer. The statistical deviation from this value reduces for wider write buffers. Based on these considerations, a degree of parallelism of the programming circuitry equal to one eighth of the write buffer would be in principle sufficient to ensure that, on average, following the programming method based on the optimised programming sequences for the different programmed states the programming time is reduced. However, a higher degree of parallelism of the programming circuitry increases the probability that, for any given write pattern, the programming method according to the present invention is faster than the conventional method.

Although the present invention has been disclosed by means of an exemplary embodiment, it is apparent to those skilled in the art that several modifications to the described exemplary embodiment, as well as other embodiments of the present invention are possible without departing from the scope thereof as defined in the appended claims.

For example, although described in connection with a four-levels memory, the programming method of the present invention can be advantageously applied in general to any kind of multi-level memory, irrespective of the number of programming levels and of the kind of physical mechanism exploited for programming the memory cells (e.g., hot-electron injection or electron tunnelling, as in EEPROMs and Flash memories with NAND architecture).

The present invention is not limited to the examples described above. Many alternative embodiments are possible without departing from the scope defined by the appended claims. For example, it should be obvious to those of ordinary skill in the art in view of the present discussion that alternative embodiments of the new and novel memory circuit may be implemented in an integrated circuit comprising a circuit supporting substrate that supports at least a portion of the new and novel memory circuit discussed above. Additionally, the new and novel memory circuit may be implemented in a computing system comprising a computing circuit and at least one such memory circuit thereby providing the advantages of the present invention to such computing system.

While there has been illustrated and described what are presently considered to be the preferred embodiments of the present invention, it will be understood by those of ordinary skill in the art that various other modifications may be made, and equivalents may be substituted, without departing from the true scope of the present invention.

Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. A method of programming a multi-level, electrically-programmable memory including memory cells electrically programmable into at least two distinct programmed states, the method comprising:
    defining at least two programming sequences, each programming sequence being designed for electrically programming memory cells into at least one respective programmed state;
    selecting a group of memory cells of the memory;
    receiving a pattern of data to be written into the selected group of memory cells of the memory;
    analysing the pattern for determining sub-groups of memory cells, each sub-group of memory cells including the memory cells in the selected group that are to be brought into at least one respective programmed state of the at least two distinct programmed states; and
    submitting the memory cells in each sub-group to the respective programing sequence, wherein each of the at least two programming sequences includes applying to a control electrode of the memory cells a voltage ramp, the at least two programming sequences having voltage ramps of different slope.

2. The method of claim 1, including submitting the different sub-groups of memory cells to the respective programming sequences in succession.

3. A method of programming a multi-level, electrically-programmable memory including memory cells electrically programmable into at least two distinct programmed states, the method comprising:
    defining at least two programming sequences, each programming sequence being designed for electrically programming memory cells into at least one respective programmed state;
    selecting a group of memory cells of the memory;
    receiving a pattern of data to be written into the selected group of memory cells of the memory;
    analyzing the pattern for determining sub-groups of memory cells, each sub-group of memory cells including the memory cells in the selected group that are to be brought into at least one respective programmed state of the at least two distinct programmed states;
    submitting the memory cells in each sub-group to the respective programming sequence, and
    submitting the different sub-groups of memory cells to the respective programming sequences in succession, wherein the submitting in succession includes establishing a memory cell sub-group programming succession such that biasing conditions in which the memory cells of any given sub-group are verified as programmed to the desired programmed state are substantially close to biasing conditions in which the memory cells will be read in a standard read access.

4. The method of claim 3, wherein the establishing the memory cell sub-group programming succession includes ordering the sub-group of memory cells according to a decreasing distance of the corresponding programming states from a non-programmed state of the memory cells.

5. The method of claim 3, wherein each of the at least two programming sequences includes applying to a control electrode of the memory cells a voltage ramp, the at least two programming sequences having voltage ramps of different slope.

6. The method of claim 5, including submitting the different sub-groups of memory cells to the respective programming sequences in succession.

7. The method of claim 6, wherein the submitting in succession includes establishing a memory cell sub-group programming succession such that biasing conditions in which the memory cells of any given sub-group are verified as programmed to the desired programmed state are substantially close to biasing conditions in which the memory cells will be read in a standard read access.

8. The method of claim 7, wherein the establishing the memory cell sub-group programming succession includes ordering the sub-group of memory cells according to a decreasing distance of the corresponding programming states from a non-programmed state of the memory cells.

9. The method of claim 5, wherein a programming sequence associated with a programmed state closest to a non-programmed state of the memory cells includes applying to the control electrode of the memory cells a voltage ramp having a first slope.

10. The method of claim 9, wherein at least one of the programming sequences associated with programmed states intermediate between the state closest to and the state most distant from the non-programmed state includes:
    applying to a control electrode of the memory cells a first voltage ramp having a third slope intermediate between the first slope and the second slope;
    verifying the programmed state of the memory cells;
    as soon as one of the memory cells is verified to have reached the desired programmed state, applying to the control electrode of the memory cells a second voltage ramp having a fourth slope equal to or higher than the first slope, but lower than the third slope.

11. The method of claim 9, wherein a programming sequence associated with a programmed state most distant from the non-programmed state of the memory cells includes applying to a control electrode of the memory cells a voltage ramp having a second slope higher than the first slope.

12. The method of claim 11, wherein at least one of the programming sequences associated with programmed states intermediate between the state closest to and the state most distant from the non-programmed state includes:
  applying to a control electrode of the memory cells a first voltage ramp having a third slope intermediate between the first slope and the second slope;
  verifying the programmed state of the memory cells;
  as soon as one of the memory cells is verified to have reached the desired programmed state, applying to the control electrode of the memory cells a second voltage ramp having a fourth slope equal to or higher than the first slope, but lower than the third slope.

13. The method of claim 11, including submitting the different sub-groups of memory cells to the respective programming sequences in succession.

14. The method of claim 13, wherein the submitting in succession includes establishing a memory cell sub-group programming succession such that biasing conditions in which the memory cells of any given sub-group are verified as programmed to the desired programmed state are substantially close to biasing conditions in which the memory cells will be read in a standard read access.

15. The method of claim 14, wherein the establishing the memory cell sub-group programing succession includes ordering the sub-group of memory cells according to a decreasing distance of the corresponding programming states from a non-programmed state of the memory cells.

16. The method of claim 3, including:
  defining a default programming sequence, the default programming sequence being designed so as to be adapted to bring a memory cell into any one of the programmed states;
  defining an average programming time required on average for programming the selected group of memory cells using the default programming sequence;
  after having determined the sub-groups of memory cells, estimating an overall programming dine required for programming the selected group of memory cells using the at least two programming sequences;
  comparing the estimated overall programming time to the average programming time; and
  if the estimated overall programming time exceeds the average programming time, programming the selected group of memory cells using the default programming sequence.

17. The method of claim 16, wherein the default programming sequence corresponds to a programming sequence associated with a programmed state closest to the non-programmed state of the memory cells.

18. A multi-level, electrically-programmable memory with memory cells electrically programmable into at least two distinct programmed states, comprising:
  means for determining subgroups of memory cells within a selected group of memory cells to be electrically programmed, each sub-group of memory cells including the memory cells in the selected group that are to be brought into at least one respective programmed state of the at least two distinct programmed states; and
  means for submitting the memory cells in each sub-group to a respective programming sequence by:
  defining at least two programming sequences, each programming sequence being designed for electrically programming memory cells into at least one respective programmed state;
  selecting a group of memory cells of the memory;
  receiving a pattern of data to be written into the selected group of memory cells of the memory;
  analyzing the pattern for determining sub-groups of memory cells each sub-group of memory cells including the memory cells in the selected group that are to be brought into at least one respective programmed state of the at least two distinct programmed states; and
  submitting the memory cells in each sub-group to the respective programming sequence,
  wherein each of the at least two programming sequences includes applying to a control electrode of the memory cells a voltage ramp, the at least two programming sequences having voltage ramps of different slope.

19. A computing system comprising:
a computing circuit; and
at least one memory circuit, electrically coupled with the computing circuit, each of the at least one memory circuit including:
  a multi-level, electrically-programmable memory with memory cells electrically programmable into at least two distinct programmed states, comprising:
    means for determining sub-groups of memory cells within a selected group of memory cells to be electrically programmed, each sub-group of memory cells including the memory cells in the selected group that are to be brought into at least one respective programmed state of the at least two distinct programmed states; and
means for submitting the memory cells in each sub-group to a respective programming sequence by:
defining at least two programming sequences, each programming sequence being designed for electrically programming memory cells into at least one respective programmed state;
selecting a group of memory cells of the memory;
receiving a pattern of data to be written into the selected group of memory cells of the memory;
analyzing the pattern for determining sub-groups of memory cells, each sub-group of memory cells including the memory cells in the selected group that are to be brought into at least one respective programmed state of the at least two distinct programmed states; and
submitting the memory cells in each sub-group to the respective programming sequence,
wherein each of the at least two programming sequences includes applying to a control electrode of the memory cells a voltage ramp, the at least two programming sequences having voltage ramps of different slope.

20. A method of programming a multi-level, electrically-programming memory including memory cells electrically programmable into at least two distinct programmed states, the method comprising:
  defining at least two programming sequences, each programming sequence being designed for electrically programming memory cells into at least one respective programmed state;
  selecting a group of memory cells of the memory;
  receiving a pattern of data to be written into the selected group of memory cells of the memory;
  analyzing the pattern for determining sub-groups of memory cells, each sub-group of memory cells including the memory cells in the selected group that are to be brought into at least one respective programmed state of the at least two distinct programmed states;
  submitting the memory cells in each sub-group to the respective programming sequence;

defining a default programming sequence, the default programming sequence being designed so as to be adapted to bring a memory cell into any one of the programmed states;

defining an average programming time required on average for programming the selected group of memory cells using the default programming sequence;

after having determined the sub-groups of memory cells, estimating an overall programming time required for programming the selected group of memory cells using the at least two programming sequences;

comparing the estimated overall programming time to the average programming time; and if the estimated overall programming time exceeds the average programming time, programming the selected group of memory cells using the default programming sequence.

21. The method of claim 20, wherein the default programming sequence corresponds to a programming sequence associated with a programmed state closest to the non-programmed state of the memory cells.

* * * * *